United States Patent
Bohn et al.

(10) Patent No.: US 6,588,476 B1
(45) Date of Patent: Jul. 8, 2003

(54) METHOD AND APPARATUS FOR PRODUCING A FAULTLESS MATERIAL WEB, AS WELL AS FAULTLESS MATERIAL WEB

(75) Inventors: Martin Bohn, Reutlingen (DE); Wolfgang Scheller, Oberpleichfeld (DE); Helmut Hoegenett, Nideggen (DE)

(73) Assignee: bielomatik Leuze GmbH + Co. (DE)

( * ) Notice: Subject to any disclaimer, the term of this patent is extended or adjusted under 35 U.S.C. 154(b) by 73 days.

(21) Appl. No.: 09/696,763

(22) Filed: Oct. 25, 2000

(30) Foreign Application Priority Data

Oct. 29, 1999 (DE) .......................... 199 52 471

(51) Int. Cl.[7] .............................. B07C 5/344
(52) U.S. Cl. ............... 156/378; 156/379; 209/509; 209/534; 209/549; 209/552; 209/606; 209/643; 209/905; 209/923
(58) Field of Search ................. 156/378, 379; 209/509, 905, 923, 534, 549, 552, 606, 643

(56) References Cited

U.S. PATENT DOCUMENTS 5,950,842 A * 9/1999 Baur .................... 209/540
6,222,145 B1 * 4/2001 Cook .................... 209/573

FOREIGN PATENT DOCUMENTS

| DE | 197 34 119 | 11/1998 |
| DE | 197 34 635 | 2/1999 |
| DE | 19848716 A1 | 4/2000 |

\* cited by examiner

Primary Examiner—Nasser Ahmad
(74) Attorney, Agent, or Firm—Akerman Senterfitt

(57) ABSTRACT

The problem of the invention is to provide a material web, comprising a supporting web and information carriers positioned thereon, in which the supporting web is constructed as a continuous web and on which are only located faultless information carriers.

According to the invention from one material web are separated at least the faulty information carriers and a uniform sequence of faultless information carriers is produced on a supporting web.

18 Claims, 7 Drawing Sheets

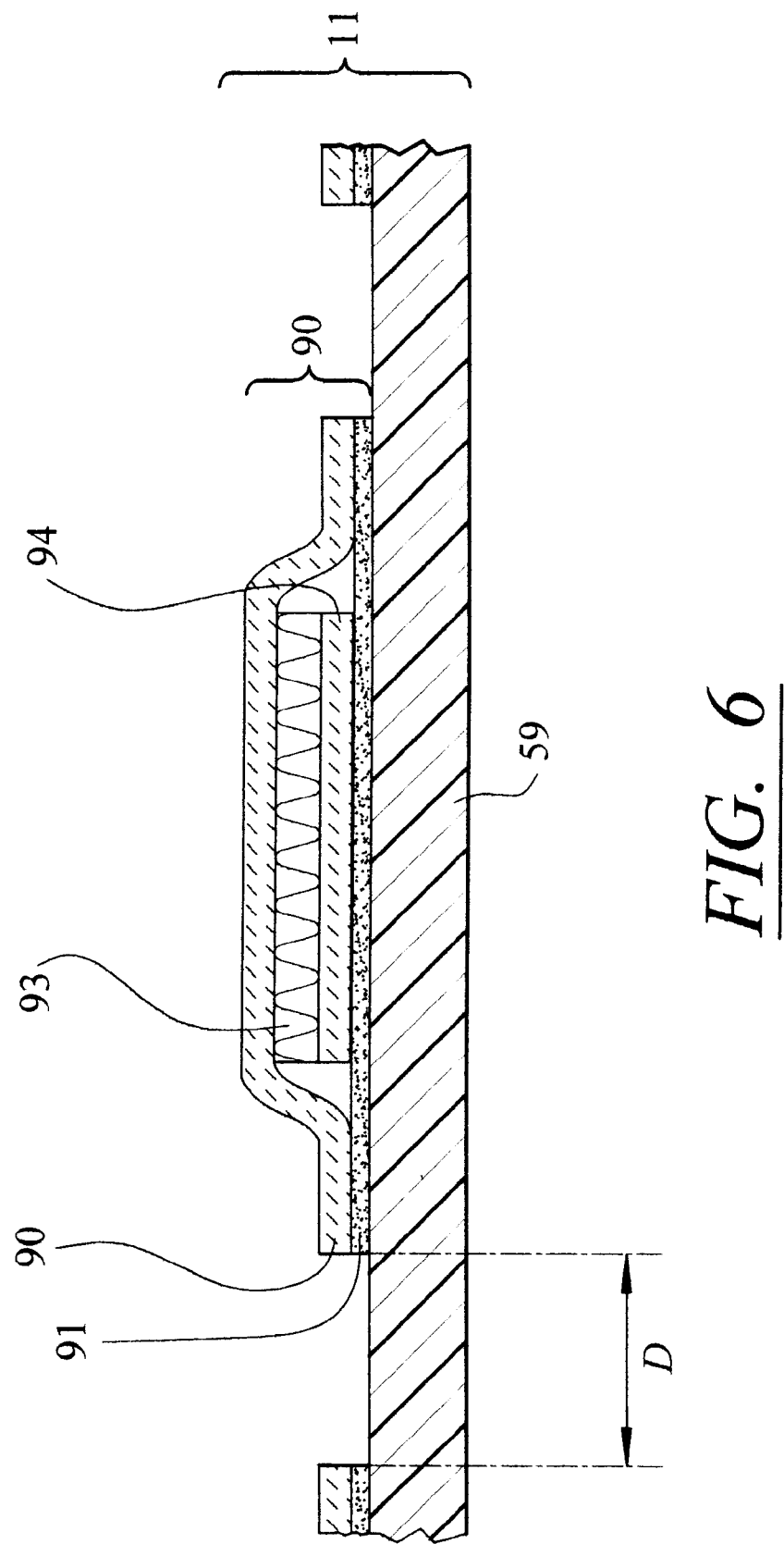

METHOD AND APPARATUS FOR PRODUCING A FAULTLESS MATERIAL WEB, AS WELL AS FAULTLESS MATERIAL WEB

BACKGROUND OF INVENTION

The invention relates to a method and an apparatus for producing a faultless material web, as well as to a faultless material web.

The not previously published DE 19 848 716 discloses a method and an apparatus for producing a sequence of faultless components on a material web. In this method a material web comprising a supporting web on which are arranged information carriers at regular intervals is supplied. The supplied web contains not only faultless information carriers, but also information carriers having faults. The fault rate is in the range of the production waste of information carrier manufacture. However, for the further processing of the information carriers it is necessary to eliminate all faulty information carriers. For this purpose, according to the prior art method, the supplied material web is monitored for faulty information carriers. If an information carrier is detected as being faulty, then in a cutting device the supporting web is cut through both immediately upstream and also immediately downstream of the faulty information carrier. Subsequently the free ends of the supporting web are bonded and pressed together.

The material web production apparatus forming a basis for said document has a supply of a material web having faulty parts, a cutting device for cutting the supporting web of the material web, a bonding and pressing device for the automatic placing on one another of the free ends of the supporting web and a discharge device, in which the discharged sequence of faultless information carriers is collected for further processing.

In the method and apparatus according to said prior art the supporting web of the material web is cut through and then engaged again. This prevents a permanent reuse of the supporting web, because it has a plurality of cutting and refastening points to which no information carriers can be applied. In addition, at the bonding or welding points, in certain circumstances the supporting web has thickened portions, which may prove prejudicial during the further processing of the information carriers.

The problem of the invention is to provide a material web, comprising a supporting web and information carriers located thereon, in which the supporting web is constructed as a continuous web and on which are only located faultless information carriers with a uniform grid dimension.

Based on the preamble features, the characterizing features of the independent claims serve to solve the set problem.

SUMMARY OF THE INVENTION

In the method according to the invention for producing a faultless material web with information carriers detachably applied thereto, the supply takes place of a material web also having faulty information carriers. At least the faulty information carriers are detached or separated from the supporting web of the material web supplied. Then, exclusively faultless information carriers are arranged in uniformly spaced manner on the material web. Further developments of the method according to the invention can be gathered from the dependent subclaims.

Apparatuses according to the invention for producing a faultless material web have a supply device for supplying a material web, which has faulty information carriers, as well as a first discharge device for the material web exclusively having faultless information carriers. For the identification of faulty information carriers an identification device is provided past which is moved the information carriers. For the separation of information carriers from the material web having the faulty information carriers a detaching or separating device is provided.

Further developments of the apparatus according to the invention can be gathered from the dependent subclaims.

The material web according to the invention has information carriers detachably located on a supporting web. The supporting web is constructed as a flowing, continuous web. Only faultless information carriers are arranged in uniformly spaced manner on the supporting web.

Further developments of the material web according to the invention can be gathered from the dependent subclaims.

BRIEF DESCRIPTION OF THE DRAWINGS

The invention is described in greater detail hereinafter relative to non-limitative embodiments and the attached drawings, wherein show:

FIG. 6 The diagrammatic representation of a material web according to the invention.

DETAILED DESCRIPTION

Figure 1:
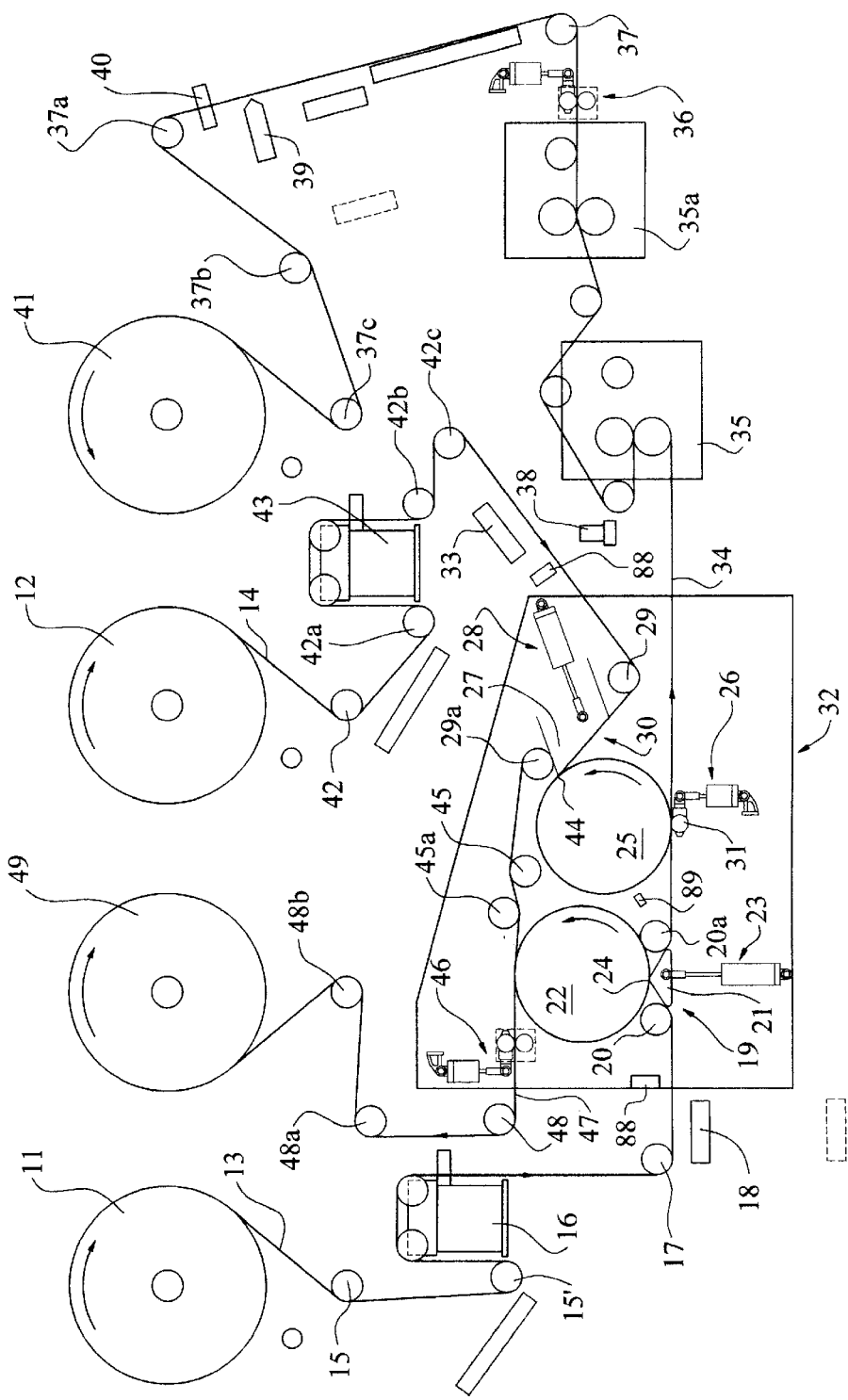
FIG. 1 An apparatus according to the invention for performing a method according to the invention.

FIG. 1 shows an apparatus according to the invention having two supply devices for material webs having faulty information carriers, as well as in each case one discharge device for a material web exclusively having faultless information carriers and a material web which only has faulty information carriers. The material web is in each case formed from a supporting web which has information carriers arranged at regular intervals. According to the embodiments shown the supply devices comprise rollers 11, 12 located on winding mandrels and from each of which is unwound a material web 13, 14, which can also have faulty information carriers. The first material web 13 unwound from the roller 11 is supplied by means of the deflection rollers or pulleys 15, 15' to the material web straightener 16. If the deflection roller 15 is arranged in pivotable manner, it can also serve as a buffer store for the material web by pivoting it in such a way that, as a function of requirements the path of the material web from deflection roller 15 to deflection roller 15' is made longer or shorter. The buffer action can also be used for regulating the tension in the material or supporting web. The tension can e.g. be applied by means of an accumulator or the like acting on the pivotable deflection roller. If the tension is controllable or regulatable, then it is possible for it to be detected by means of corresponding measuring rolls, which can simultaneously serve as deflection pulleys.

With respect to its position at right angles to its advance direction the first material web 13 is precisely oriented in the material web straightener 16. By means of the further deflection roller 17 the first material web 13 is moved past the identification device 18. The identification device 18 detects the individual information carriers moved past it, reads the information content thereof and checks the same against predetermined criteria for information content correctness. If an information carrier corresponds to the established criteria, then it is considered to be faultless. However, if it does not comply with said criteria, it is considered not to be faultless or faulty.

For the separation or removal of faulty information carriers from the material web 13 the separating device 19 is provided. The separating device 19 is formed from two guide rollers 20, 20a, the peeling wedge 21 and the suction roll 22. The peeling wedge 21 can be brought by means of the regulating member 23 in the web path in such a way that the peeling wedge deflects the linear conveying direction of the material web between the two guide rollers 20, 20a and consequently in the vicinity of the separation edge 24 of the peeling wedge 21 the material web is deflected with a very small deflection radius. If the peeling wedge changes the path of the material web 13, then the suction roll 22 is in the vicinity of the separation edge 24 in engagement with the material web 13. The cooperation of the peeling wedge 21 with its separation edge 24 and the suction roll 22 leads to a separation or peeling of the information carrier located in the vicinity of the separation edge 24. The peeling wedge 21 is brought into the engagement position shown if in the identification device 18 a faulty information carrier is identified and this is located in the vicinity of the peeling wedge 21 as a result of the advance of the material web. It must be ensured that the peeling wedge is brought into the represented engagement position as a function of the material web speed in such a way that the start of the information carrier detected as not being faultless then passes into the vicinity of the separation edge 24 when the latter is already in engagement with the suction roll 22. For this purpose it may be necessary to reduce the conveying speed of the material web or to effect a timed advance of the material web with respect to individual information carriers. Following the peeling or separation of the faulty information carrier, by means of the regulating member 23 the peeling wedge 21 is then moved out of the direct connection between the two guide rollers 20, 20a. In the then attained inoperative position the material web 13, optionally still in engagement with the peeling wedge 21, particularly its separation edge 24, then undergoes no further narrow radius deflection through the peeling wedge 21. Thus, there is no longer any peeling or separation of the information carrier then moved past the peeling wedge 21. In this inoperative position the information carriers detected as being faultless are moved past the peeling wedge 21. For web control purposes sensors 88 can be provided, which can detect a position of the web or an information carrier with respect to the peeling wedge 21 or 28.

Following onto this the material web, which only has faultless information carriers or gaps, is then conveyed on. The drive mechanism 36 drives the material web. The cooperation between the second suction roll 25 and the pressure roll 31 ensures an appropriate contact pressure for the taking over or acceptance of a faultless information carrier. If an information carrier is accepted, the pressure roll 31 can be moved away from the suction roll 25. The path from the separation point from the first material web 13 to the engagement point of the second conveying member 21 on the material web 13 should be longer than the longest processable extension of an information carrier. By means of the suction roll the material web 13 can be supplied with the information carriers recognized as being faultless and by means of a suitable control of the rotation speed of the second suction roll 25 and the advance of the material web 13 a positionally precise supply of faultless information carriers is ensured, so that the information carriers detected as being faultless can be inserted in accurately fitting manner in the gap which arises if in the separation device 19 a faulty information carrier has been separated from the material web 13. For this purpose at the predetermined position with respect to the engagement point of the second conveying member on the first material web a sensor 89 can be provided, which monitors the making ready of a faultless information carrier on the conveying member 25. For the conveying of an information carrier the two conveying members 22, 25 preferably have in each case a conveying length exceeding the longest information carrier to be processed.

Through the cooperation of the separating device 19 and the accurately fitting insertion of a faultless information carrier from the first material web 13 having faulty information carriers is formed a faultless material web 34 only having faultless information carriers. Said web is moved past a monitoring device 38, e.g. a camera, in order to monitor that there has been a correct insertion of the faultless information carriers. In the subsequently arrangeable working stations 35, 35a further working of the material web with the information carriers can take place. The introduction of predetermined separation points can then be provided e.g. at desired points of the information carrier or on the supporting web. By means of the further drive mechanism 36 the conveying of the material web with the desired advance is ensured. By means of the deflection roller 37 the material web incorporating the same supporting web as the original material web 13 passes to the marking device 39. The information carriers can consequently be marked in a continuous sequence. They can e.g. be continuously numbered ensuring that each continuously numbered information carrier is also suitable for use and that no waste is also counted. The material web 34 is then passed through the counter 40, where the information carriers can once again be counted, so that it is possible to subdivide the material web 34 into segments, which in each case have the same number of usable information carriers. By means of further deflection rollers 37a, 37b and 37c the material web 34 is guided to the discharge device for the faultless information carriers and which is in the form of a winding station 41. Instead of winding up the material web 34, there can also be a material web stacking, stacking e.g. taking place through the stacking of a zig-zag folded material web, folding taking place between successive information carriers, so that no information carrier becomes creased. If there is a winding of faultless material web 34 in a winding station 41, the deflection roller 37c can serve as a buffer store by positioning it in such a way that its location with respect to the winding station 41 can be modified and consequently the web length between winding station 41 and deflection roller 37b can be changed.

To enable the material web 13 to be supplied with faultless information carriers, a second material web 14 is provided, which can be unwound from the material web roll 12. The material web 14 can also have faulty information carriers. It is supplied by means of the deflection rollers 42, 42a to the web straightener 43 where the position of the second material web 14 transversely to its conveying direction is adjusted. The material web 14 is then guided by means of the deflection rollers 42b, 42c, after which it is moved past the second identification device 33. Identification device 33 corresponds to identification device 18 and is used for distinguishing between faulty and faultless information carriers on the basis of predetermined criteria. The material web 14 is then guided to the second separating device 30, which is formed from the guide rollers 29, 29a, the peeling wedge 27 and the suction roller 25. The peeling wedge 27 is located at the regulating member 28 and can be moved into an operating position in the straight connecting line between the two guide rollers 29, 29a, as illustrated in the drawing. In said operating position information carriers are separated at the separating edge 44 of the peeling wedge 27 in that the separating edge is in engagement with the suction roll 25 and has a confined radius. Corresponding to the separating device 19 the peeling wedge 27 can also be brought into a position in which it does not deflect the material web in such a way that there is a peeling or separation of information carriers from the supporting web of the material web 14. Unlike in the case of the separation of faulty information carriers from the material web 13, by means of the peeling wedge 27 there is a separation of faultless information carriers from the material web 14. Following the guide roller 29a, the material web is brought by means of further deflection rollers 45, 45a into engagement with the suction roll 22. The web advance of the second material web 14 and the rotation speed of the two suction rolls 22, 25 is controlled in such a way that in the engagement area of the second material web 14 on the suction roll 22, on said second material web 14 is introduced in a gap resulting from a peeled, faultless information carrier the faulty information carrier peeled from the first material web 13 and taken over by the suction roll 22. For this purpose it may be necessary to move the second material web 14 both forwards and backwards. The conveying device 46 is provided for this purpose. As a result of the forward and rearward conveying of the second material web 14 it is possible to ensure that all faultless information carriers are separated therefrom. When this has taken place, following the application of the faulty information carriers from the suction roll 22, the material web 14 becomes the waste web 47 and, guided by means of the deflection rollers 48, 48a, 48b, is wound onto the winding drum 49.

Corresponding to the cooperation of the deflection rollers 37b, 37c there can also be a buffer action of the material web length of the waste web 47 through the cooperation of the deflection rollers 48a, 48b.

In place of the positionally precise acceptance of the faulty information carriers from the conveying member 22 by the second material web 14, there can also be a random acceptance and then several information carriers can be superimposed on the waste web 47. There is then no need for a conveying back of the material web 14. As a further alternative, in place of the acceptance of the faulty information carriers on a waste web 47, there can also be a random other conveying away, e.g. a suction thereof.

Figure 2:
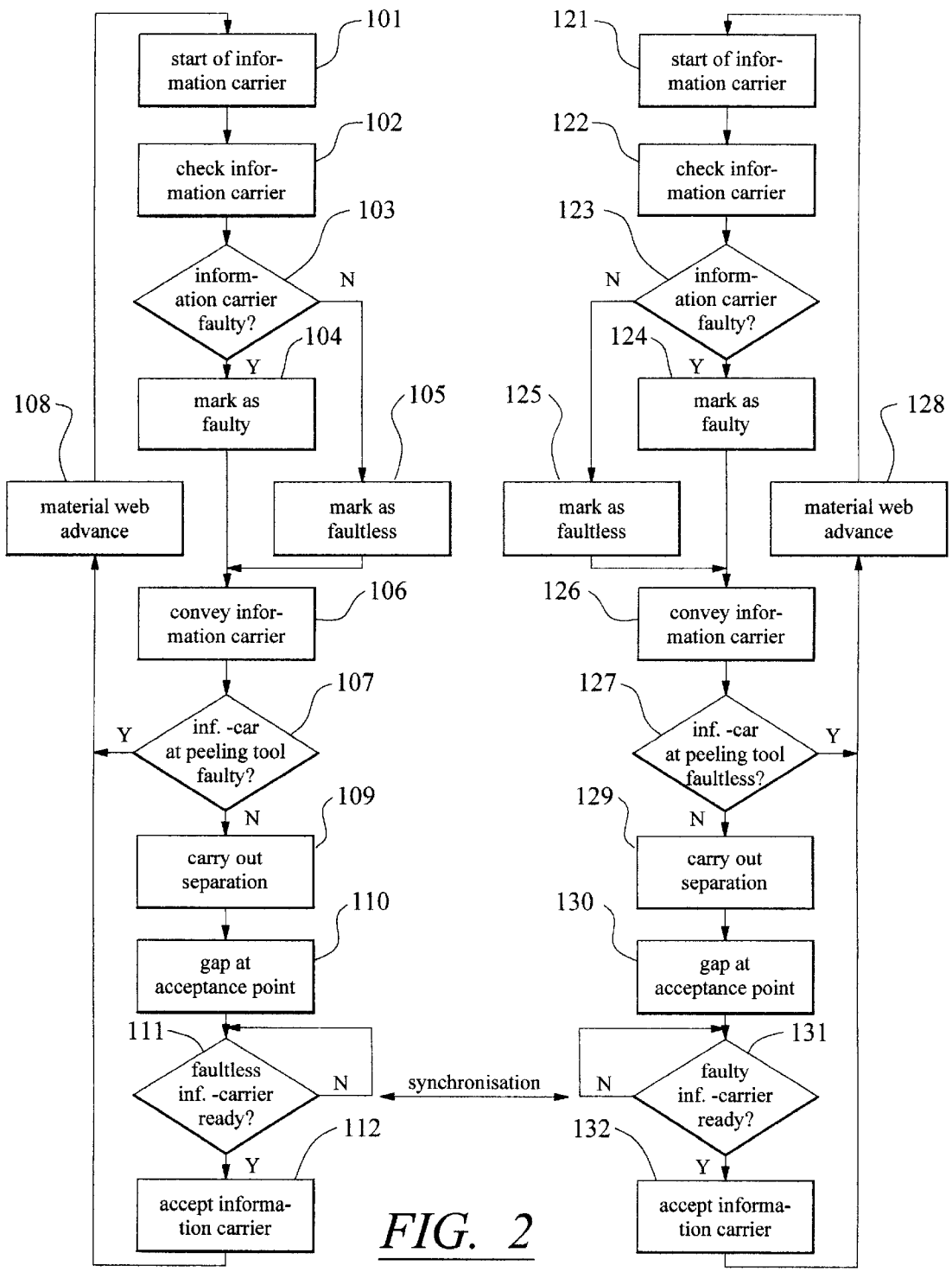
FIG. 2 The flowchart of a first method according to the invention for performance on the first apparatus according to the invention.

FIG. 2 diagrammatically shows the flowchart of a method according to the invention suitable for performance on the apparatus of FIG. 1.

The method is subdivided into two sequences, which take place in parallel and are synchronized with one another. The method according to FIG. 2 can be performed both with a timed advance of the material webs and with a continuous advance of the material webs. It is important that the identification device has sufficient time to be able to identify faulty information carriers and that it is also possible to synchronize with one another the advance and conveying of the separated information carriers.

The method steps 101 to 112 essentially relate to the procedure concerning the first material web and method steps 121 to 132 relate essentially to the second material web. According to steps 101 or 121 in the vicinity of the particular identification device monitoring takes place to establish whether there is a start of an information carrier, i.e. a straightening takes place. According to step 102 or 122 a monitoring routine is performed for the information carrier positioned at the identification device. According to step 103 or 123 monitoring takes place to establish whether the information carrier is faulty, i.e. whether it fails to comply with certain predetermined criteria, or whether it is faultless, i.e. adequately fulfils the predetermined criteria. In accordance with the existence of a faulty or faultless information carrier, the particular information carrier of the corresponding material web is marked as faulty or faultless in accordance with steps 104 or 105 or 124 or 125. The marking of an information carrier can be performed in the association of a logic information in a storage means independently of the actual information carrier and/or simultaneously in physical form on the information carrier, e.g. by the application of a corresponding characteristic. If marking is in the form of a logic information association, then it must be known how many information carriers are located between the identification device and the peeling or separating device for the information carriers, so that the association up to this time is not lost. In step 106 or 126 the information carrier with its information association concerning faultiness is conveyed up to the peeling or separating tool. According to step 107, as in the case of the first material web, monitoring takes place to establish whether the information carrier which has reached the peeling tool has the information as to whether or not it is faulty associated with it. If the information carrier is not faulty, there is a jump to step 108 and the material web is conveyed on by the length of one information carrier. There is then a jump back to step 101. It must be borne in mind that steps 101 to 106 take place simultaneously, like steps 107 to 112 and this also occurs in each case for two different information carriers at different material web points. The same applies for the corresponding steps of the method with respect to the second material web.

If it has been established in step 107 that the present information carrier is faulty, it cannot remain on the first material web, so that there is a transfer to step 109 according to which the corresponding peeling wedge 21, as the guidance element for the material web in the advance direction, is brought into contact with the first material web. During the further advance of the material web there is a complete separation of the faulty information carrier. In accordance with step 110 the resulting gap is conveyed on until its leading end reaches the application point on the second suction roll 25. According to step 111 monitoring takes place to establish whether a faultless information carrier is already located on the second suction roll. If this is not the case, a holding pattern is adopted. However, simultaneously the sequence control point for the second material web is informed that at the first suction roll 22 there is a faulty information carrier waiting for acceptance. According to step 112 which is carried out if it is established in step 111 that a faultless information carrier is already present at the suction roll 25, the accurate fitting acceptance of said information carrier from the suction roll 25 on the first material web 13 commences and consequently becomes the faultless material web 34, in that the front end of the information carrier is inserted in accurate fitting manner in the gap of the peeled information carrier. For this purpose the suction roll 25 is moved on synchronously with the advance of the material web 13. Following onto step 112 there is a jump back to step 108, according to which the material web can be further advanced. Simultaneously with the sequence of steps 107 to 112 are performed steps 127 to 132 for the second material web.

Monitoring takes place in step 127 to establish whether the information carrier present at the separating device 30 has been marked as faulty and if this is the case there is a jump to step 128 and the next information carrier is advanced until it is possible to pass over to step 121. In the opposite case, i.e. if in step 127 it was established that the information carrier in the vicinity of the separating device 30 is faultless, then according to step 129 the separation of the information carrier is performed through cooperation of the separating device 30 and the suction roll 25. Following onto this and in accordance with step 130 the gap resulting from this separation process is conveyed on until the application point of the first suction roll on the second material web 14 is reached. According to step 131 monitoring takes place to establish whether at the suction roll 22 there is a faulty information carrier ready for acceptance by the second material web, which consequently becomes the waste web 47. If this is not the case, a holding pattern is adopted. Simultaneously the control unit for the first material web is informed that there is already a faultless information carrier at the suction roll 25.

As soon as a faulty information carrier is available at the first suction roll 22 for acceptance by the second material web, in accordance with step 132 said information carrier is accepted by the second material web, in that the latter is advanced synchronously with the rotation of the first suction roll. There can be a pressing of the information carrier onto the second material web by a conveying through the feed mechanism 46. Subsequently and in accordance with step 128 the next, faultless information carrier located downstream of the position where the previous information carrier was separated and substituted, is positioned in the vicinity of the separating device. Thus, all succeeding, faultless information carriers can be separated from the second material web 14, so that the latter only has faulty information carriers in an uninterrupted sequence. Alternatively thereto it would also be possible to effect no conveying back of the second material web and instead to simply use it as a second material web until at least virtually all the faultless information carriers were separated and transferred to a faultless information web 34. The choice of these two methods is dependent on the stochastic frequency of faulty information carriers.

Figure 3:
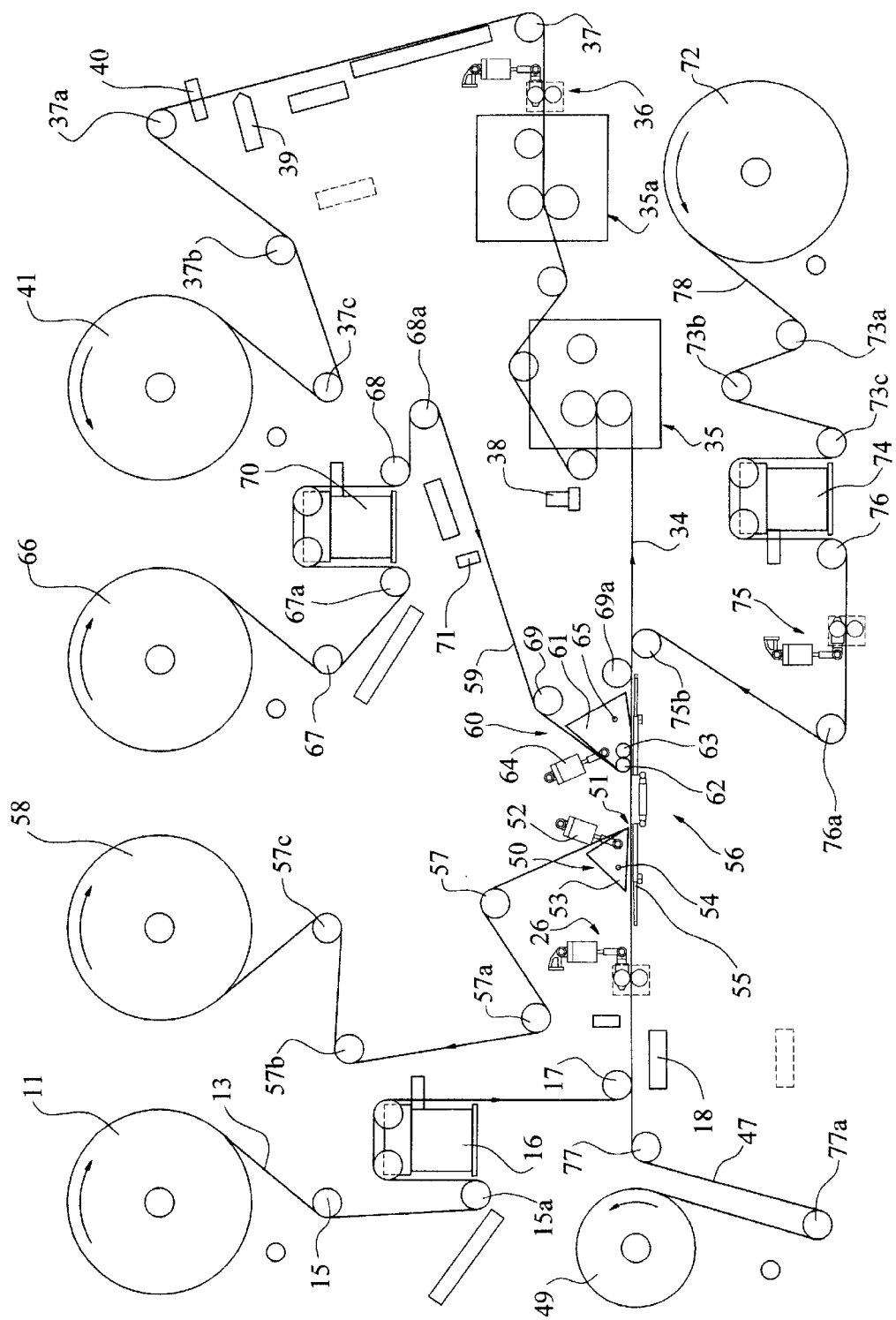
FIG. 3 A second apparatus according to the invention for the performance of a method according to the invention.

FIG. 3 shows a second embodiment of an apparatus according to the invention suitable for performing a method according to the invention. Said apparatus has a supply device 11 for the supply of a first material web 13, which can also include faulty information carriers. By means of the deflection rollers 15, 15*a* the first material web 13 is fed to the web straightener 16 and as a result the web edge position can be adjusted. The material web 13 is then moved past the identification device 18 by means of the deflection roller 17. The identification device 18 checks on the basis of predetermined criteria information carriers moved past it to ensure that they are free from faults. The first material web 13 then passes to the drive mechanism 26 by means of which the material web 13 is either conveyed continuously or in stepwise, timed manner. The material web then reaches the separating device 50 formed by a separating wedge 53, which is articulated to a pivot pin 54 and pivotable about the latter operated by the regulating member 52. The separating wedge 53 has the separating edge 51 over which is guided the material web 13. In the represented operating position of the separating wedge 53, the separating edge 51 is in engagement with a suction disk 55 of the transfer means 56. If an information carrier of the material web 13 is moved past the separating edge, it starts to separate from the supporting web of material web 13. It is subject to suction action by the suction disk 55 and is taken over by the latter. It is consequently separated from the supporting web of material web 13. Following the separation of an information carrier the separating wedge 53 is returned to the inoperative position in which the separating edge 51 is no longer in engagement with a suction disk 55, so that the latter can be conveyed on in unhindered manner and a new suction disk 55 can be brought into position with respect to the separating edge 51 of the separating wedge 53. The first material web 13 can either pass through continuously or in a timed cycle and is in each case advanced by the length of one information carrier. After moving past the separating wedge 53 through which all the information carriers are separated from the first material web 13, the now empty supporting web of the first material web 13 is guided over the deflection rollers 57, 57*a*, 57*b*, 57*c* and then wound onto the drum 58. The supporting web of material web 13 wound onto the drum 58 an either be reused by again providing it with information carriers, or some other type of supporting web recycling can take place. In conjunction the deflection roller 57*b*, which can be fixed, and the deflection roller 57*c*, which can move relative to the roller 57*b*, can form a buffer storage means, so that there can be a continuous, uninterrupted winding of the supporting web of material web 13 even if there was previously a timed conveying of the first material web to the separating device. Buffer storage takes place by modifying the path length between the deflection roller 57*b* and the drum 58.

Thus, the information carriers separated from the material web are individualized on the suction disks 55. A monitoring of the information carrier can take place on the suction disk 55, either additionally or alternatively to the identification device 18. Through the rotation of the suction disk, e.g. by 90°, there can be a new orientation of the information carrier with respect to the conveying direction of the accepting supporting web 59. It can be advantageous for production reasons that in the production of the information carriers they are located with their longitudinal axis in the running direction of the supporting web of material web 13 and is then located on the supporting web 59 with its transverse axis in the running direction of said web 59. The subsequent further processing can then take place e.g. in the conveying direction of the material web 14 and not at right angles thereto. Information carriers identified as faultless on the basis of the established criteria are accepted on a supporting web 59.

The supporting web 59 is then supplied to the acceptance device 60 by unwinding from drum 66 and feeding via deflection rollers 67, 67*a*. In the straightener 70 the supporting web 59 is then straightened with respect to its position at right angles to the conveying direction and then passes via the deflection rollers 68, 68*a* to the guide roller 69. Upstream of guide rollers 69 can be provided a sensor 71, which checks the supporting web for damage and/or produces a position reference between an engraving or embossing of the supporting web 59 and the acceptance point of an information carrier on said supporting web. Downstream of the guide roller 69 the supporting web 59 is fed into the acceptance device 60 by means of the guide wedge 61. Said guide wedge has at its tip the two pressure rollers 62, 63 by means of which the supporting web guided by them is pressed onto the information carrier located on the suction disk 55, so that the information carrier is adhesively fastened to the supporting web 59. Thus, the supporting web 59, now only having faultless information carriers, becomes the material web 34, to ensure that in the acceptance device 60 are only accepted faultless information carriers, the guide wedge 61 is pivotably mounted on the pivot pin 65 and can be brought by the regulating member 64 into the represented operating position, in that the pressure rollers 62, 63 bring the supporting web into engagement on the information carriers on the suction disk 55 and into a second inoperative position where the pressure rollers 62, 63 are removed from the suction disk 55 to such an extent that there is no acceptance of an information carrier. The guide wedge 61 is in the latter position if either a suction disk with a faulty information carrier is moved past the same or if an empty suction disk 55 is removed or a suction disk 55 having an information carrier is to be supplied.

Following the acceptance of the information carrier the supporting web 59, which can now be referred to as a material web 34 only having faultless information carriers in uniformly spaced manner is removed by means of the guide roller 69*a*. It is possible to check by means of a checking device 38, e.g. a camera, whether the acceptance of the information carriers by the supporting web has taken place in faultless manner. In accordance with the procedure described relative to FIG. 1, the faultless material web 34 can now be supplied to the working stations 35, 35*a* for further material web working or processing. A drive mechanism 36 now ensures the further conveying of the material web via the deflection rollers 37 past the marking station 39 and counter 40, via the deflection rollers 37*a*, 37*b*, 37*c* to the winding station 41 where the counter-free material web 34 is wound up.

The transfer means 56 with its suction disks 55 will now be described in greater detail relative to FIG. 5. For the acceptance of faulty information carriers a supporting web 78 is unwound from a make ready roller 72 and is guided by means of the guide rollers 73*a*, 73*b*, which with the previously described relative position change can form a buffer store and is supplied by means of the deflection roller 73*c* to a web straightener 74. From there the supporting web passes via the deflection rollers 76, drive mechanism 75 and further deflection rollers 76*a*, 76*b* into the vicinity of the transfer means 56. In this area the supporting web 78 is oriented parallel to the first material web 13 and the faultless material web 34 and is at the same height, but passes alongside the two aforementioned webs and in the represented manner upstream of the two other webs. Thus, the empty supporting web 78 passes into the vicinity of the transfer means 56 in such a way that it accepts the information carriers not transferred to the faultless material web 34, because they were detected as being faulty, and consequently becomes the waste web 47. By means of further deflection rollers 77, 77*a*, which can also form a buffer store in known manner, the waste web 47 passes to the winding drum 49, where it is wound up.

Figure 4:
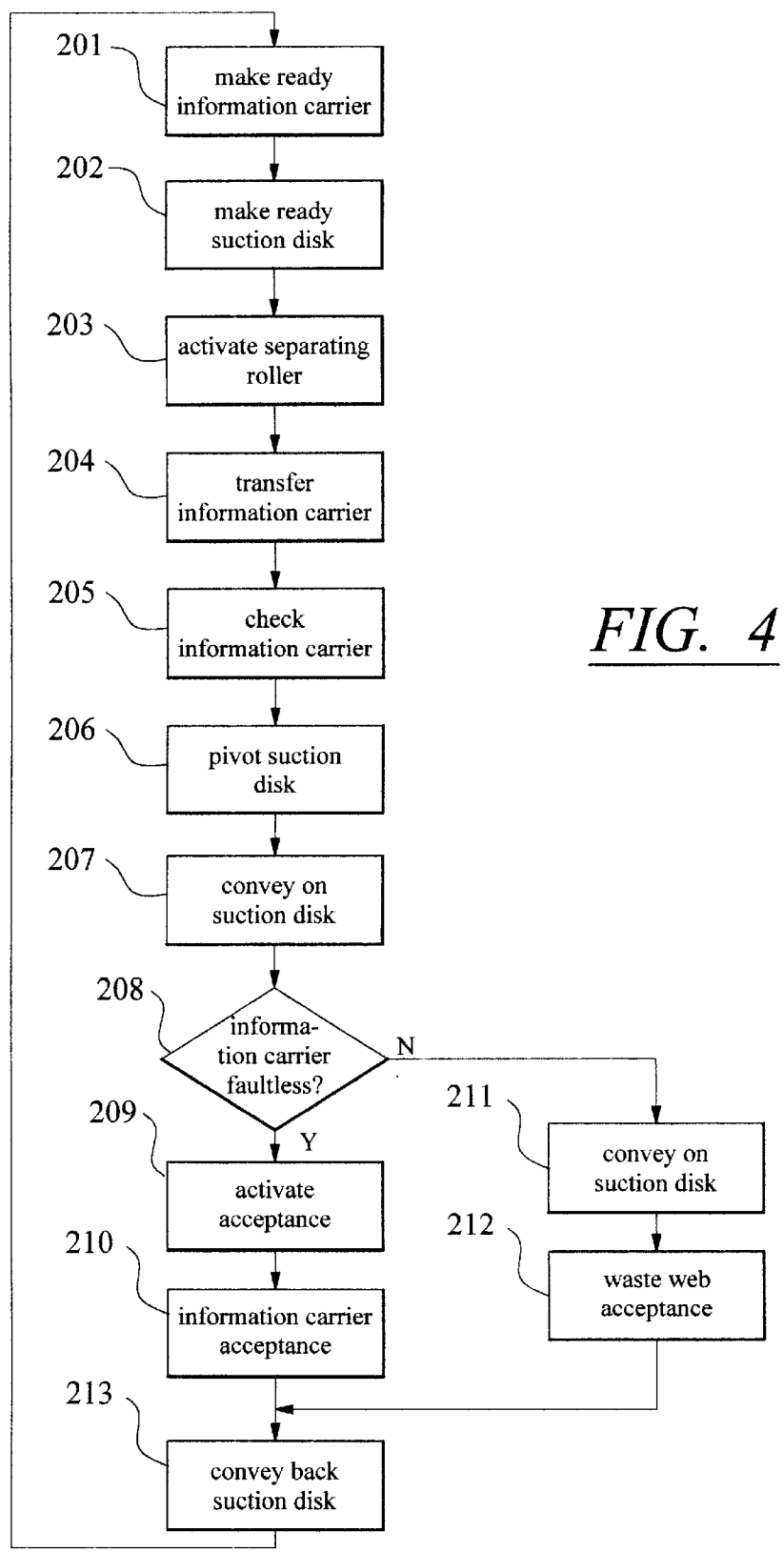
FIG. 4 The flowchart of a second method according to the invention for performance on the second apparatus according to the invention.

FIG. 4 diagrammatically shows the flowchart of a method for performance on an apparatus according to FIG. 3. In this method it is assumed that the checking of the information carriers for freedom from faults takes place during the conveying on the suction disk 55. If the checking for fault freedom of the information carrier is to be performed in an upstream identification device 18 and not on the suction disk 55 then, in accordance with the method of FIG. 2, there must be a marking of the information carriers at least in logic form and this information is conveyed on together with the information carriers.

According to step 201 an information carrier is made ready at the separating device 19. According to step 202 an empty suction disk is made available in the vicinity of the separating device 19. According to step 203 the peeling wedge 21 is engaged with the suction disk 55 and the information carrier is peeled from the first material web and transferred to the suction disk 55. For better transfer to the suction disk suction of the information carrier can take place through said disk. Following the transfer of the information carrier to the suction disk according to step 204, according to step 205 the information carrier is monitored to establish whether it is faultless. When carrying out the monitoring operation the suction disk 207 is conveyed on. It can be pivoted by 90°, so that the information carrier is reoriented with respect to the conveying direction of the faultless material web.

Before the suction disk comes into the acceptance position at acceptance device 60, it is established whether the information carrier is faultless or faulty. If the information carrier is faulty, according to step 208 there is a jump to step 211, the suction disk then being moved past the acceptance device without the information carrier being accepted on the faultless material web 34. Then, according to step 212, at another point, namely at the conveying back side of the suction disk 55, the information carrier is accepted in accordance with step 212 by the supporting web 78, which consequently becomes the waste web 47. There is then a jump to step 213.

If it was established in step 208 that the information carrier was faultless, there is a transfer to step 209. According to this method step the acceptance device 60 is activated in that the guide wedge 61 is brought by the regulating member 64 with its pressure rollers 62, 63 into engagement with the information carrier on the suction disk 55. According to step 210 the faultless information carrier is accepted by the supporting web 59, which consequently becomes the faultless material web 34. Acceptance takes place in that a permanently adhering bond is produced between the information carrier and the supporting web, but which can be separated. There is then a passage to step 213.

According to step 213, following the acceptance of the information carrier already placed on it, the suction disk is conveyed back so that it can once again accept a new information carrier. It is pivoted back into its starting position if, during the conveying to the acceptance device there has been a pivoting of the suction disk, in order to reorient the information carrier.

Figure 5A:
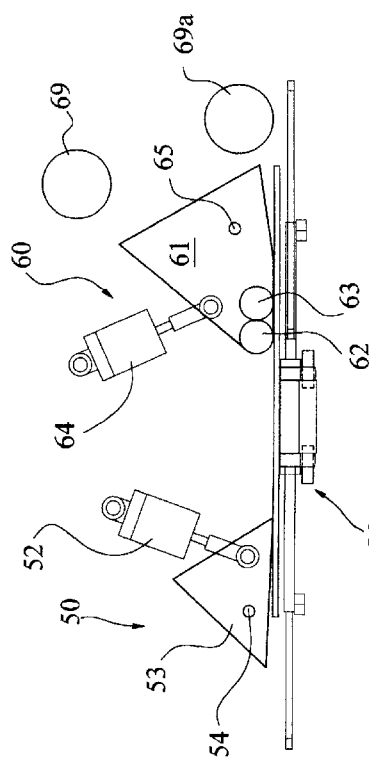
FIGS. 5a & 5b A transfer means for information carriers.
Figure 5B:
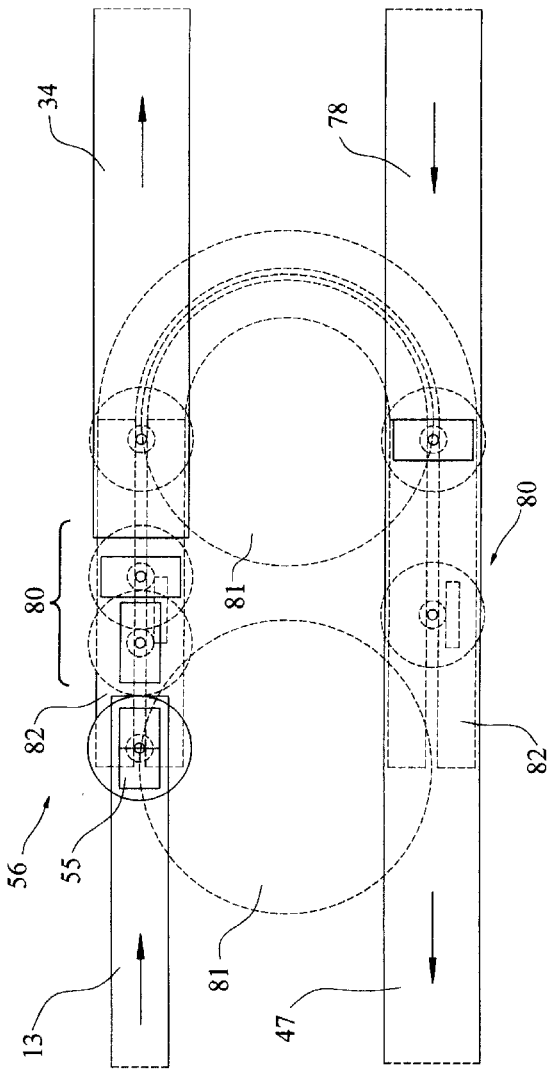

FIG. 5 is subdivided into the two views of FIG. 5*a*, which is a larger scale view of the transfer means 56 of FIG. 3 and a FIG. 5*b*, which is a plan view of the transfer means 56, but where neither the separating device 50, nor the acceptance device 60 are shown.

As can be gathered from FIG. 5*a*, the separating device 50 comprises the separating wedge 53, which can be brought into engagement with the suction disk 55 of the transfer means 56, by pivoting about its pivot pin 54 through the regulating member 52. Whilst the separating wedge is in engagement with the suction disk 55, there is a continuous advance of the latter. This can only be ensured in that the information carrier and the supporting web of the first material web 13 is moved into engagement on the suction disk 55 relative to the separating wedge 53. The suction disk 55 can then be brought in transfer means 56 to the acceptance device 60. The acceptance device 60 comprises the two guide rollers 69, 69a, as well as the guide wedge 61 with its two pressure rollers 62, 63. Operated by the regulating member 64, the guide wedge 61 can be pivoted about the pivot pin 65. Thus, the guide wedge 61 can be brought into planned engagement on a suction disk 55, if a suction disk with a faultless information carrier is supplied to the acceptance device 60.

FIG. 5b shows the view of the transfer means 56 from above, as well as the path of the material webs. The first material web 13, which can also have faulty information carriers, is supplied. It passes into the vicinity of the suction disk 55 and is then moved away upwards over the separating wedge 53. The information carrier on the first material web 13 with its longer side oriented in the direction of the material web conveying direction, is accepted by the suction disk 55, which is then advanced further. In the vicinity of the guide rail 82 by means of which the suction disk 55 is also conveyed, is formed a pivoting device 80, which rotates by 90° in a clearly defined pivoting direction the suction disk 55, so that the information carrier with its longer lateral edge is oriented transversely to the conveying direction of a path conveying it. In the case of the pivoting device there can be both a forced guidance of the suction disk and also an active, driven pivoting device. After pivoting the suction disk 55 is conveyed on, so that it passes into the vicinity of the acceptance device 60. In the vicinity of the acceptance device 60 the information carrier is taken from the suction disk 55 and transferred to the material web 34 in the case of a faultless information carrier. Monitoring to establish whether it is a faultless information carrier can also take place by means of an identification device 18 positioned on the suction disk 55. The information carriers are individualized on the suction disk 55, so that in each case only one information carrier is located on a suction disk 55. Following the area in which the suction disk 55 has been guided by the guide rails 82 and which extends longitudinally between the areas of the separating device 50 and the acceptance device 60, a rotary table 81 is provided enabling the suction disk 55 to perform a 180° curve. The suction disk 55 maintains an orientation in which the longitudinal side of the information carrier is at right angles to the conveying direction of a supporting web. The curve described by the rotary table is so large that, spaced from the first material web 13 and the faultless material web 34, but parallel to said two webs, it is possible to supply an empty supporting web 78. In an acceptance area following onto the other end of the rotary table, the empty supporting web 78 accepts a faulty information carrier which may be located on the suction disk 55. Thus, the empty supporting web 78 becomes the waste web 47. The suction disks 55 are now pivoted back in a further pivoting device into the starting direction thereof in which they can accept information carriers from the first material web 13. By means of a further rotary table 81 the suction disks 55 are brought back into the vicinity of the separating device 50. The suction disks 55 are given this name, because they are able to suck up with a clearly defined force the information carriers by means of a suitable suction device, which can be located in the actual suction disk or in the guidance means for said suction disks 55. This in particular facilitates the acceptance of the information carrier from the first material web in the vicinity of the separating device 50. Suction can preferably be maintained over the entire feed time of the information carrier on the suction disk 55. For removing the information carrier from the suction disk 55 it is also possible to produce a blast air stream.

In a not to scale, diagrammatic representation FIG. 6 shows an example for a material web. It is a material web 11, which comprises the supporting web 59 and the information carriers 90 located thereon. The information carriers 90 have a regular spacing D on the material web 11, the supporting web 59 in an uninterrupted continuation of its material, e.g. a silicone-coated paper material or the like, extends uninterruptedly over the entire material web length.

In this case the information carrier 90 comprises a label, which is formed from a covering layer 92, e.g. a film or a paper or a combination of a film and paper and a transponder 93 placed beneath the covering layer with its insulating layer 94 located on the underside. The covering layer 92, transponder 93 and insulating layer 94 form an inseparably joined unit detachably connected to the supporting web 59 by means of the adhesive coating adhering to the information carrier. The supporting web 59 is constructed in such a way that the adhesive coating 91 is applied permanently, but detachably to the supporting web 59 in such a way that it can be removed again therefrom in damage-free manner.

In the case of the information carriers, which need not necessarily have a transponder, these can e.g. be all types of coatings, layers or intermediate layers of other marking devices and correction pieces, such as flight tickets, case tags, security papers, packet labels, chip cards, etc. or such articles. It is merely necessary to apply the information carrier to a corresponding supporting web suitable for receiving information, which can be automatically read and processed and checked for correctness. The information can e.g. be bar code labelling, security marks such as holograms, transmitted light patterns, etc.

Figure 7:
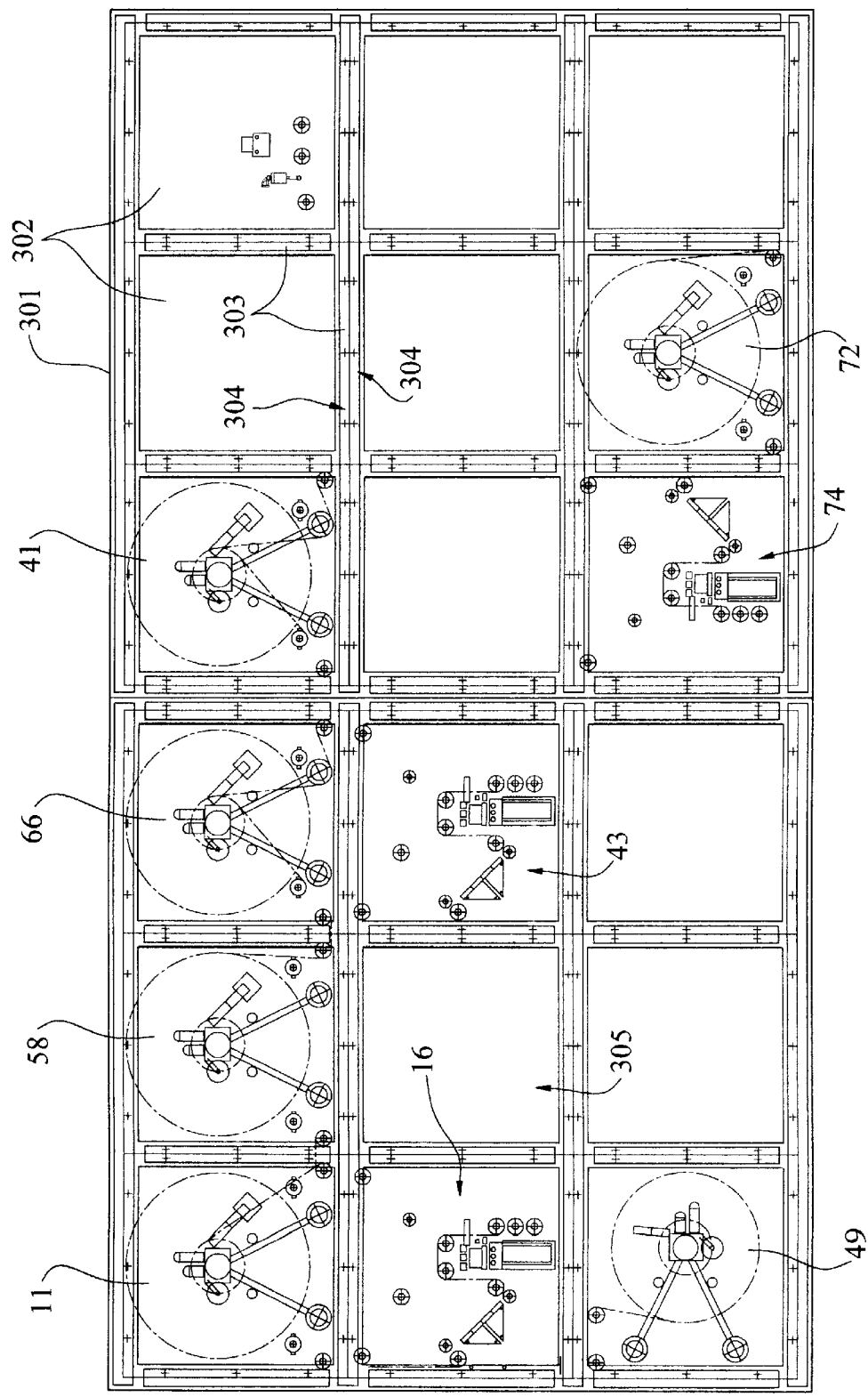
FIG. 7 The development of an apparatus according to the invention.

FIG. 7 shows a preferred configuration possibility for the apparatus according to the invention.

The apparatus according to the invention comprises a common frame 301. The outer frame 301 has a subdivision into fields 302, which are in each case bounded by transverse and upright side parts 303, which have at regular intervals holes for fastening inserts. As a result of this procedure a uniform grid scale of fields is created, which in each case have identical, fixed sizes and which individually or in groups can receive a prefabricated subassembly. On the back of the frame are provided all the supply and control lines, particularly data bus lines and for each of said fields 302 there is a connection possibility to a common data bus or a general power supply for the individual components.

At the back there can also be a specific field which is equipped with a drive unit such as a drive motor. The frame part can either be fixed to a substructure, which is not shown and which is ensured that the frame does not tilt forwards and rearwards, or can be linked in fixed manner to the building in which the machine is located.

A unit constructed as a module can be installed in each of the fields 302. In the represented frame is provided part of the necessary components, such as are necessary for performing the method of FIGS. 3 and 4. The frame contains the web straighteners 16, 43, 74, which project forwards from a base and this undergoes fixing to the holes 34 of the lateral edges 303. In each case one compartment receives the winding devices for the material webs together with the drums and in each case at least one associated deflection roller, which by means of a swivel arm is movable in position with respect to the winding drum and the deflection rollers arranged in fixed manner with respect to the frame, so that in each case there can be a buffer storage of the material web or supporting web length. Thus, there are rolls for the first material web 11, drums 58 for receiving the supporting web to be recycled of the first material web, drum 66 for making available the supporting web for the faultless material web 34, the winding station 41 for receiving the faultless material web 34, the make ready roll 72 for making ready the empty material web for receiving waste and the winding drums 49 for receiving the waste web. The drawing does not show the transfer means 56 to be placed in the free field 305 in accordance with the method sequence. As required, the further free fields can receive further working or processing stations in accordance with the requirement profile of the user and which are integrated into the sequence.

It is also possible for a particular working station to extend over several, particularly two directly adjacent compartments instead of a single compartment. This is e.g. the case with the changer 32 of FIG. 1, which extends over two horizontally adjacent compartments and inter alia incorporates the two separating devices 19, 30, as well as the two suction rolls 22, 25 and which, considered spatially, could not be housed in a single compartment.

What is claimed is:

1. Apparatus for producing a faultless material web carrying only faultless material, said material being information carriers, comprising:

a supply device for a material web carrying faulty and faultless information carriers, the information carriers being detachably fixed to and separable from the material web in a damage-free manner;

at least one identification device for identification of faulty information carriers;

at least one separating device for separating faulty information carriers from the material web;

the separating device comprising a peeling member for the material web, the peeling member having a curved portion for applying a confined radius to the material web, whereby the information carrier can be peeled from the material web by deflecting said material web to create a faultless material web carrying only faultless information carriers.

2. Apparatus for producing a faultless material web carrying only faultless material, said material being information carriers, comprising:

a supply devices for two material webs each carrying faulty and faultless information carriers, each of the two material webs associated with an identification device for identifying faulty information carriers;

a separating device for separating from the first of the two material webs only faulty information carriers and separating from the second of the two material webs only faultless information carriers;

a conveying member for each of the two material webs for conveying the separated information carriers to the other material web to create a faultless material web carrying only faultless information carriers and a faulty material web carrying only faulty information carriers; and a conveying control device for controlling the conveying of the material webs.

3. Apparatus according to claim 2, wherein a path from a separation point from the first material web to a transferring point of one of the conveying members to the material web is greater than a longest extension of the information carrier.

4. Apparatus according to claim 2, wherein the information carriers are separable from the material webs in a damage-free manner.

5. Apparatus according to claim 2, wherein the separating device comprises a peeling member for the material webs, the peeling member having a curved portion with a confined radius for peeling the information carrier from the material web by deflecting said material web.

6. Apparatus according to claim 1, wherein a conveying member is provided in the vicinity of the separating device for receiving and conveying separated information carriers.

7. Apparatus according to claim 6, wherein the conveying member is a suction roll.

8. Apparatus according to claim 6, wherein the conveying member conveys the information carriers in individualized form and orients the position of the information carriers with respect to a supporting web.

9. Apparatus according to claim 5, wherein the peeling member is movable and can be brought into a conveying path of the material web for separation of a specific information carrier from said material web and can subsequently be moved out again.

10. Apparatus for producing a faultless material web carrying only faultless material, said material being information carriers, comprising:

a supply device for a material web carrying faulty and faultless information carriers, the information carriers being detachably fixed to and separable from the material web in a damage-free manner;

at least one identification device for identification of faulty information carriers;

at least one separating device for separating all of the information carriers from the material web;

the separating device comprising a peeling member for the material web provided for peeling the information carriers therefrom by deflecting the material web;

a supply for an empty supporting web for receiving faultless information carriers, the separating device transferring all the information carriers to a conveying member, conveying in individualized manner the information carriers to a transferring device and taking up faultless information carriers on the supporting web from the conveying member depending on whether the information carrier has been identified as faultless or faulty by the identification device, and creating a faultless material web containing only faultless information carriers.

11. Apparatus according to claim 10, wherein there is a waste web for receiving faulty information carriers and a transferring device for accepting faulty information carriers on the waste web and wherein the conveying member conveys the faulty information carriers to said transferring device.

12. Apparatus according to claim 10, wherein the identification device is located in the vicinity of the conveying member or is integrated into the conveying member.

13. Apparatus according to claim 10, wherein the position with respect to the supporting web of the information carrier is oriented during conveying.

14. Apparatus according to claim 1, wherein a frame is provided having fields to which prefabricated subassemblies can be fixed in the necessary arrangement.

15. Apparatus according to claim 1, wherein the material web has a contact area contacting the information carriers, said contact area containing silicone.

16. Apparatus according to claim 1, wherein the material web comprises a coated paper web.

17. Apparatus according to claim 1, wherein the information carriers are detachably fixed to the material web by means of an adhesive coating.

18. Apparatus according to claim 1, wherein the adhesive coating adheres to the supporting web, but can be separated therefrom in an almost residue-free manner.

* * * * *